(12) United States Patent
Iwasaki et al.

(10) Patent No.: US 7,446,455 B2
(45) Date of Patent: Nov. 4, 2008

(54) THIN FILM ELASTIC WAVE RESONATOR

(75) Inventors: Tomohiro Iwasaki, Osaka (JP); Keiji Onishi, Osaka (JP); Hiroshi Nakatsuka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 72 days.

(21) Appl. No.: 11/666,135

(22) PCT Filed: Dec. 6, 2005

(86) PCT No.: PCT/JP2005/022348

§ 371 (c)(1),
(2), (4) Date: Apr. 24, 2007

(87) PCT Pub. No.: WO2006/062082

PCT Pub. Date: Jun. 15, 2006

(65) Prior Publication Data

US 2008/0122321 A1 May 29, 2008

(30) Foreign Application Priority Data

Dec. 7, 2004 (JP) ............................. 2004-354515
Mar. 28, 2005 (JP) ............................. 2005-092863
Mar. 28, 2005 (JP) ............................. 2005-092864

(51) Int. Cl.
*H01L 41/08* (2006.01)

(52) U.S. Cl. ...................................... 310/321

(58) Field of Classification Search ......... 310/363–366, 310/320–324, 311; 333/193, 187
See application file for complete search history.

(56) References Cited

U.S. PATENT DOCUMENTS 7,368,859 B2 * 5/2008 Yokoyama et al. .......... 310/320
2005/0151600 A1 7/2005 Takeuchi et al.

FOREIGN PATENT DOCUMENTS

JP 44-11605 5/1969

(Continued)

*Primary Examiner*—Thomas M. Dougherty
*Assistant Examiner*—Karen Addison
(74) *Attorney, Agent, or Firm*—Wenderoth, Lind & Ponack, L.L.P.

(57) ABSTRACT

An upper electrode (50) includes a first electrode section (51) formed in a circular shape and a second electrode section (52) and a third electrode section (53) formed in a fan-shaped manner outside of the first electrode section (51). The first, second, and third electrode sections (51 to 53) are electrically separated from one another via an insulating region. A lower electrode (30) includes a fourth electrode section (31) formed in a circular shape and a fifth electrode section (32) and a sixth electrode section (33) formed in a fan-shaped manner outside of the fourth electrode section (31). Similarly, the fourth, fifth, and sixth electrode sections (31 to 33) are electrically separated from one another via an insulating region. Further, the fourth electrode section (31) is provided so as to face the first electrode section (51) via the piezoelectric body (40), the fifth electrode section (32) is provided so as to face the second electrode section (52) via the piezoelectric body (40), and the sixth electrode section (33) is provided so as to face the third electrode section (53) via the piezoelectric body (40), respectively.

23 Claims, 19 Drawing Sheets

FOREIGN PATENT DOCUMENTS

| | | |
|---|---|---|
| JP | 52-031698 | 3/1977 |
| JP | 60-68711 | 4/1985 |
| JP | 2-113616 | 4/1990 |
| JP | 2644855 | 5/1997 |
| JP | 10-200369 | 7/1998 |
| JP | 2000-295072 | 10/2000 |
| JP | 2001-326556 | 11/2001 |
| JP | 2002-217663 | 8/2002 |
| JP | 2003-087086 | 3/2003 |
| JP | 2003-347889 | 12/2003 |

* cited by examiner

VIBRATION MODE A

VIBRATION MODE B (a)

(b)

(c)

(d)

(a)

(b)

THIN FILM ELASTIC WAVE RESONATOR

TECHNICAL FIELD

The present invention relates to a thin film elastic wave resonator and more particularly, to a thin film elastic wave resonator which allows a band-pass filter to be structured by a single resonator and realizes balance-unbalance conversion, to a filter using the same, and to a communication device using the same.

BACKGROUND ART

A component which is built in an electronic device such as a mobile device is required to be reduced in size and weight. For example, a filter used in a mobile device is required to allow precise adjustment of frequency characteristics as well as to be miniaturized. As one of filters which satisfy these requirements, a filter using a thin-film elastic wave resonator has been known (refer to patent document 1).

Hereinafter, with reference to FIG. 23, a conventional thin film elastic wave resonator will be described.

FIG. 23(a) is a diagram illustrating a cross-sectional view of a basic structure of the conventional thin-film elastic wave resonator 500. The thin film elastic wave resonator 500 has a structure in which a piezoelectric body 501 is sandwiched between an upper electrode section 502 and a lower electrode section 503. This thin film elastic wave resonator 500 is used being placed on a semiconductor substrate 505 having a cavity 504 formed therein. The cavity 504 can be formed through partially etching a back face of the semiconductor substrate 505 by using a fine processing technology. In this thin film elastic wave resonator 500, an electric field is applied by the upper electrode section 502 and the lower electrode section 503 in a thickness direction and vibration in the thickness direction is generated. Next, operations of the thin film elastic wave resonator 500 will be described with reference to longitudinal vibration in a thickness direction of an infinite flat plate.

FIG. 23(b) is a schematic diagram illustrating an oblique perspective view for describing the operations of the conventional thin film elastic wave resonator 500. When in the thin film elastic wave resonator 500, the electric field is applied between the upper electrode section 502 and the lower electrode section 503, electric energy is converted to mechanical energy by the piezoelectric body 501. The induced mechanical vibration is vibration expanding in the thickness direction, and expands and contracts in the same direction as that of the electric field. In general, the thin film elastic wave resonator 500 utilizes resonant vibration of the piezoelectric body 501 in the thickness direction and operates with resonance of a frequency at which a thickness of the piezoelectric body 501 is equal to a half-wave length. The cavity 504 shown in FIG. 23(a) is utilized in order to secure the longitudinal vibration in the thickness direction of the piezoelectric body 501.

An equivalent circuit of the thin film elastic wave resonator 500, as shown in FIG. 23(d), has both series resonance and parallel resonance. This equivalent circuit comprises: a series resonance section having a capacitor C1, an inductor L1, and a resistor R1; and a capacitor C0 connected in parallel with the series resonance section. In this circuit configuration, admittance frequency characteristics of the equivalent circuit are, as shown in FIG. 23(c), that an admittance is maximum at a resonance frequency fr and minimum at an anti-resonance frequency fa. Here, a relationship between the resonance frequency fr and the anti-resonance frequency fa is as follows.

$$fr = 1/\{2\pi\sqrt{(L1 \times C1)}\}$$

$$fa = fr\sqrt{(1+C1/C0)}$$

When the thin film elastic wave resonator 500 having such admittance frequency characteristics is adopted as a filter, since the resonant vibration of the piezoelectric body 501 is utilized, a downsized and low-loss filter can be realized. When two thin film elastic wave resonators are connected in series and in parallel (FIG. 24(a)), a band-pass filter can be easily structured (FIG. 24(b)).

In reality, since the thin film elastic wave resonator is invariably fixed on the substrate, all of the longitudinal vibration, in the thickness direction, generated at a vibration section is not excited as main resonant vibration and a part of the vibration leaks to the substrate. This vibration leakage to the substrate (unnecessary vibration) means that a part of energy to be originally used in excitation of vibration inside of the piezoelectric body is treated as a loss. Therefore, the invention which reduces an energy loss is disclosed in patent document 2 or the like.

In addition, since in a communication device using a high-frequency band, noise is generated in a transmission path (wiring) on a substrate on which various electronic components are connected, a balance-type (differential-type) transmission path is employed as a countermeasure. Here, the balance-type transmission path is a parallel transmission path which handles two signals whose amplitudes are equal to each other and whose phases are opposite to each other. Accordingly, addition of a balance-unbalance conversion function into the thin film elastic wave resonator or a band-pass filter using the thin film elastic wave resonator is required. For the balance conversion-type thin film elastic wave resonator, a structure in which two thin film elastic wave resonators are disposed in an adjacent manner so as to share a piezoelectric body and propagation (coupling) of traverse-mode vibration generated in a vibration section is utilized is often adopted. It has been well known that since the thin film elastic wave resonator generally operates with resonance of a frequency at which a thickness is equal to a half-wave length, a phase difference between the upper electrode and the lower electrode is ideally 180 degrees, thereby realizing the balance conversion.

[Patent document 1] Japanese Laid-Open Patent Publication No. 60-68711

[Patent document 2] Japanese Patent No. 2644855

DISCLOSURE OF THE INVENTION

Problems to be Solved by the Invention

In the above-mentioned invention disclosed in patent document 2, the propagation of the traverse-mode vibration generated in the vibration section is prevented by separating the upper electrode so as to be in a direction perpendicular to a direction of the propagation of an elastic wave, thereby suppressing vibration leakage from the vibration section to the substrate. Accordingly, it can be expected that a stand-alone thin film elastic wave resonator can attain favorable filter characteristics.

However, in a case where a band-pass filter, whose pass-band width is wide to some extent, is structured by using the thin film elastic wave resonator disclosed in patent document 2, as described above, two independent thin film elastic wave resonators are absolutely required (FIG. 24(a)). Therefore, there accrues a problem of high cost stemming from a large area which a semiconductor chip in a filter occupies.

In addition, in a case where a plurality of thin film elastic wave resonators are disposed in an adjacent manner, there accrues a problem of a large energy loss caused by a low degree of mode coupling among the thin film elastic wave resonators.

In addition, in a balance-unbalance conversion-type thin film elastic wave resonator in which conventional thin film elastic wave resonators are disposed in an adjacent manner in a traverse-direction, an energy loss is large similarly due to a low degree of coupling and it is difficult to concurrently realize a band-pass filter function.

Therefore, objects of the present invention are to reduce an energy loss by enhancing a degree of mode coupling among the thin film elastic wave resonators, to realize a stand-alone band-pass filter having a wide passband width, and to provide a thin film elastic wave resonator which realizes balance-unbalance conversion.

Solution to the Problems

The present invention is directed to a thin film elastic wave resonator, and a filter using the thin film elastic wave resonator, and a communication device using the thin film elastic wave resonator. To achieve the above-mentioned objects, the thin film elastic wave resonator of the present invention comprises a piezoelectric body; a first electrode section formed on one surface of the piezoelectric body; a second electrode section which is formed outside of the first electrode section, being positioned so as to be insulated from the first electrode section, on said one surface of the piezoelectric body; a third electrode section which is formed outside of the first electrode section, being positioned so as to be insulated from the first electrode section and the second electrode section, on said one surface of the piezoelectric body; a fourth electrode section formed on another surface of the piezoelectric body, which faces said one surface of the piezoelectric body; a fifth electrode section which is formed outside of the fourth electrode section, being positioned so as to be insulated from the fourth electrode section, on said another surface of the piezoelectric body; a sixth electrode section which is formed outside of the fourth electrode section, being positioned so as to be insulated from the fourth electrode section and the fifth electrode section, on said another surface of the piezoelectric body; and a supporting section, for supporting a structure formed by the piezoelectric body and the first to sixth electrode sections, which includes at least a substrate. In the thin film elastic wave resonator having this structure, an electrical signal is inputted to one of the first electrode section and the fourth electrode section, and an electrical signal is outputted from either the second electrode section and the sixth electrode section or the third electrode section and the fifth electrode section; or an electrical signal is inputted to either the second electrode section and the sixth electrode section or the third electrode section and the fifth electrode section, and an electrical signal is outputted from between the first electrode section and the fourth electrode section.

In the respective electrode sections, an area of the first electrode section is substantially equal to an area of the fourth electrode section, an area of the second electrode section is substantially equal to an area of the fifth electrode section, and an area of the third electrode section is substantially equal to an area of the sixth electrode section. The second electrode section and the fifth electrode section are provided so as to be positioned symmetrically via the piezoelectric body, and the third electrode section and the sixth electrode section are provided so as to be positioned symmetrically via the piezoelectric body, respectively. As favorable shapes of the electrode sections, the first and fourth electrode sections are circular and the second, third, fifth, and sixth electrode sections are fan-shaped. In this case, it is favorable that a center of the circular first electrode section coincides with centers of circles formed by arcs of the second and third electrode sections and a center of the circular fourth electrode section coincides with centers of circles formed by arcs of the fifth and sixth electrode sections. And it is favorable that a clearance between the first electrode section and the second electrode section and a clearance between the first electrode section and the third electrode section are equal to or greater than a thickness of the piezoelectric body. Other than these, all of the first to sixth electrode sections may be polygonal.

A typical supporting section is structured by a substrate having a cavity provided, by a substrate and a supporting layer laminated for forming a cavity on the substrate, or by an acoustic mirror formed by alternately laminating a layer in which an impedance is acoustically high and a layer in which an impedance is acoustically low. And the fourth to sixth electrode sections are disposed on the cavity or the acoustic mirror. Note that it is also possible to form the fourth electrode section and the fifth electrode section or the fourth electrode section and the sixth electrode section in an integrated manner.

EFFECT OF THE INVENTION

The above-described thin film elastic wave resonator of the present invention, having a structure of a stand-alone resonator, reduces an energy loss through enhancing a degree of mode coupling, realizes a band-pass filter having a wide passband, and allows unbalance-balance conversion to be realized.

Figure 1:
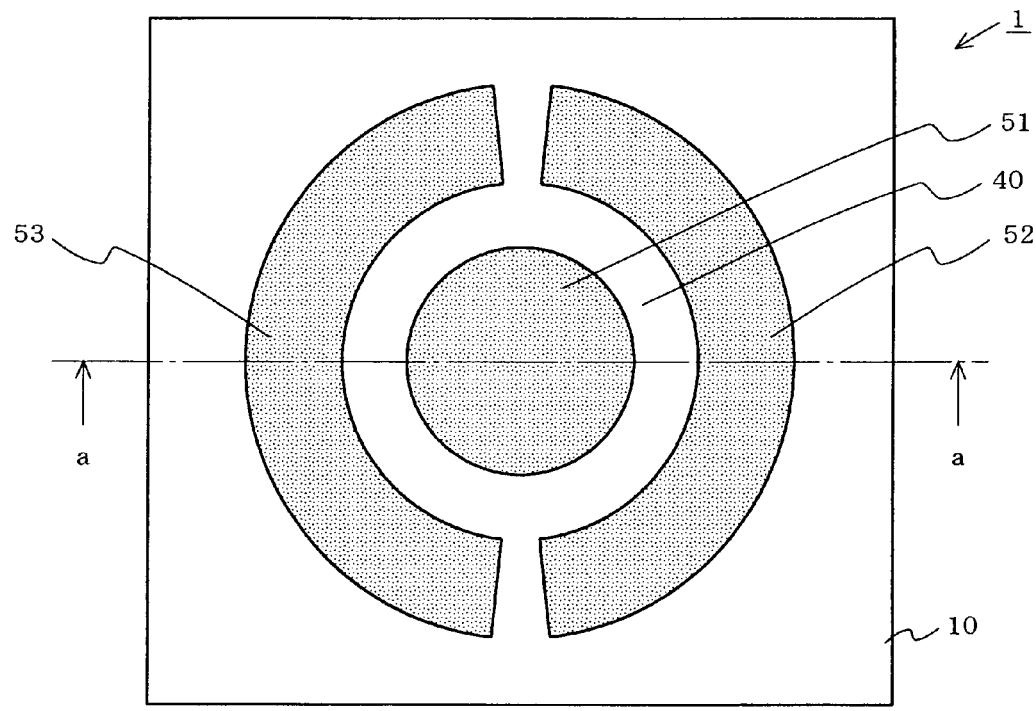
FIG. 1 is a structure diagram illustrating a top view of a thin film elastic wave resonator according to a first embodiment of the present invention.

DESCRIPTION OF THE REFERENCE CHARACTERS 1 to 4, 500 thin film elastic wave resonator
10, 505 semiconductor substrate
11, 504 cavity
20 acoustic mirror
21, 22 acoustic impedance layer
30 lower electrode
31 to 36, 51 to 56, 502, 503 electrode section
40, 501 piezoelectric body
50 upper electrode
60 vibration section
111, 112 antenna
113 switch
114 filter

BEST MODE FOR CARRYING OUT THE INVENTION

First Embodiment

Figure 2A:
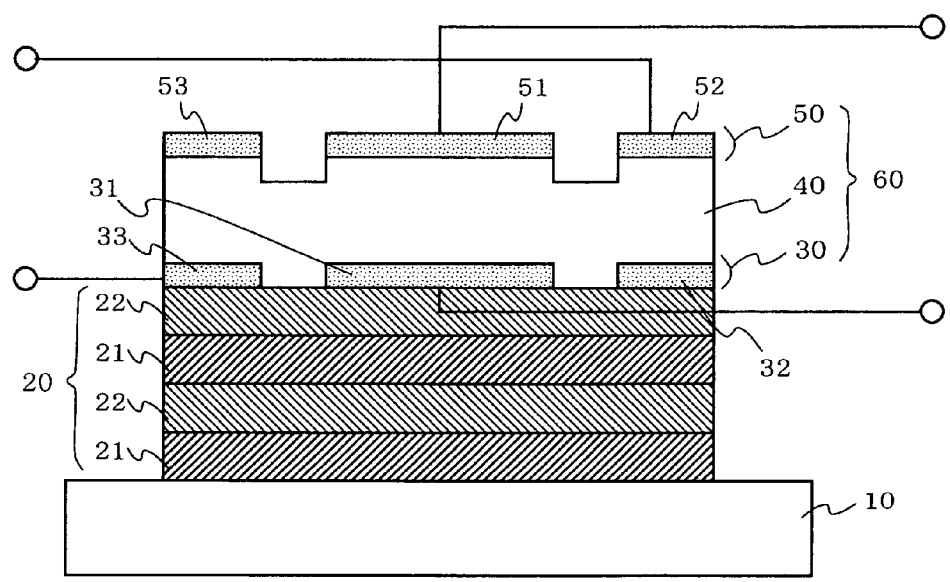
FIG. 2A is a structure diagram illustrating a cross-sectional view of the thin film elastic wave resonator according to the first embodiment of the present invention (a cross-sectional view along a line a-a shown in FIG. 1).
Figure 2B:
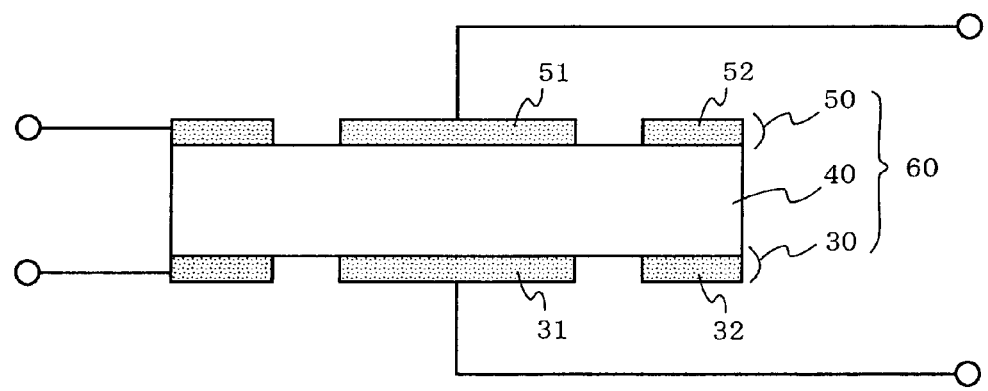
FIG. 2B is a basic structure diagram illustrating a cross-sectional view of the thin film elastic wave resonator of the present invention.
Figure 3:
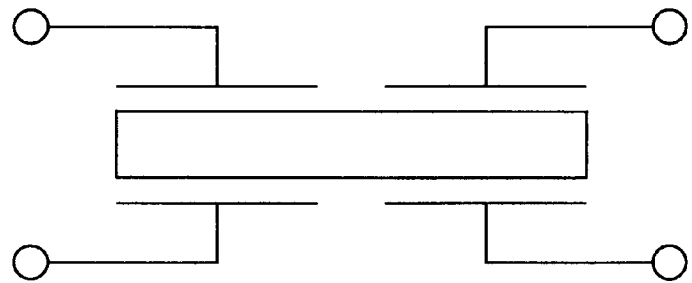
FIG. 3 is a diagram illustrating exemplary circuit symbols of the thin film elastic wave resonator according to the first embodiment of the present invention.

FIG. 1 is a diagram illustrating a top view of a constructional example of a thin film elastic wave resonator according to a first embodiment of the present invention. FIG. 2B is a diagram illustrating a cross-sectional view of a basic structure of the thin film elastic wave resonator shown in FIG. 1. along a line a-a. In the first embodiment, an example in which the thin film elastic wave resonator 1 has a cross-sectional view shown in FIG. 2A will be described. In FIGS. 1 and 2A, the thin film elastic wave resonator 1 according to the first embodiment has a structure in which an acoustic mirror 20, a lower electrode 30, a piezoelectric body 40, and an upper electrode 50 are formed in order on a semiconductor substrate 10. A vibration section 60 includes the lower electrode 30, the piezoelectric body 40, and the upper electrode 50. The lower electrode 30 and the upper electrode 50 are made of, for example, molybdenum (Mo). The piezoelectric body 40 is made of, for example, a piezoelectric material such as aluminum nitride (AlN). FIG. 3 is a diagram illustrating one example of a case where the thin film elastic wave resonator according to the first embodiment is shown by circuit symbols.

First, a structure of the thin film elastic wave resonator 1 according to the first embodiment will be described in detail.

The acoustic mirror 20 is provided for containing resonant vibration of the vibration section 60 inside of the vibration section 60. This acoustic mirror 20 is formed by alternately laminating at least two kinds of layers, a high acoustic impedance layer 21 and a low acoustic impedance layer 22 in this example, having acoustic impedances which are different from each other. Each of respective thicknesses of the high acoustic impedance layer 21 and the low acoustic impedance layer 22 is a quarter of each of respectively corresponding acoustic wave lengths. Under the lower electrode 30, the low acoustic impedance layer 22 is disposed.

The upper electrode 50 includes a first electrode section 51 which is formed in a circular shape and a second electrode section 52 and a third electrode section 53 which are formed in a fan-shaped manner outside of the first electrode section 51. The first electrode section 51, the second electrode section 52, and the third electrode section 53 are electrically separated from one another via an insulating region. Each of the second electrode section 52 and the third electrode section 53 is of a fan-shape, the area of which is formed by an inner edge, an outer edge, and two lines connecting the inner edge and the outer edge as shown in FIG. 1. Here, it is favorable that centers of circles formed by the inner edges and the outer edges of the second electrode section 52 and the third electrode section 53 coincide with a center of the first electrode section 51. In addition, it is favorable that clearances between the first electrode section 51 and the second electrode section 52 and between the first electrode section 51 and the third electrode section 53 are equal to or greater than a thickness of the piezoelectric body 40, respectively.

Similarly, the lower electrode 30 includes a fourth electrode section 31 which is formed in a circular shape and a fifth electrode section 32 and a sixth electrode section 33 which are formed in a fan-shaped manner outside of the fourth electrode section 31. The fourth electrode section 31, the fifth electrode section 32, and the sixth electrode section 33 are electrically separated from one another via an insulating region. Each of the fifth electrode section 32 and the sixth electrode section 33 is of a fan-shape, the area of which is formed by an inner edge and an outer edge, and two lines connecting the inner edge and the outer edge as shown in FIG. 1. Here, it is favorable that centers of circles formed by the inner edges and the outer edges of the fifth electrode section 32 and the sixth electrode section 33 coincide with a center of the fourth electrode section 31. In addition, it is favorable that clearances between the fourth electrode section 31 and the fifth electrode section 32 and between the fourth electrode section 31 and the sixth electrode section 33 are equal to or greater than a thickness of the piezoelectric body 40. In consideration of characteristics, it is most favorable that the fourth electrode section 31 is provided so as to face the first electrode section 51 via the piezoelectric body 40, the fifth electrode section 32 is provided so as to face the second electrode section 52 via the piezoelectric body 40, and the sixth electrode section 33 is provided so as to face the third electrode section 53 via the piezoelectric body 40, respectively.

Figure 4:
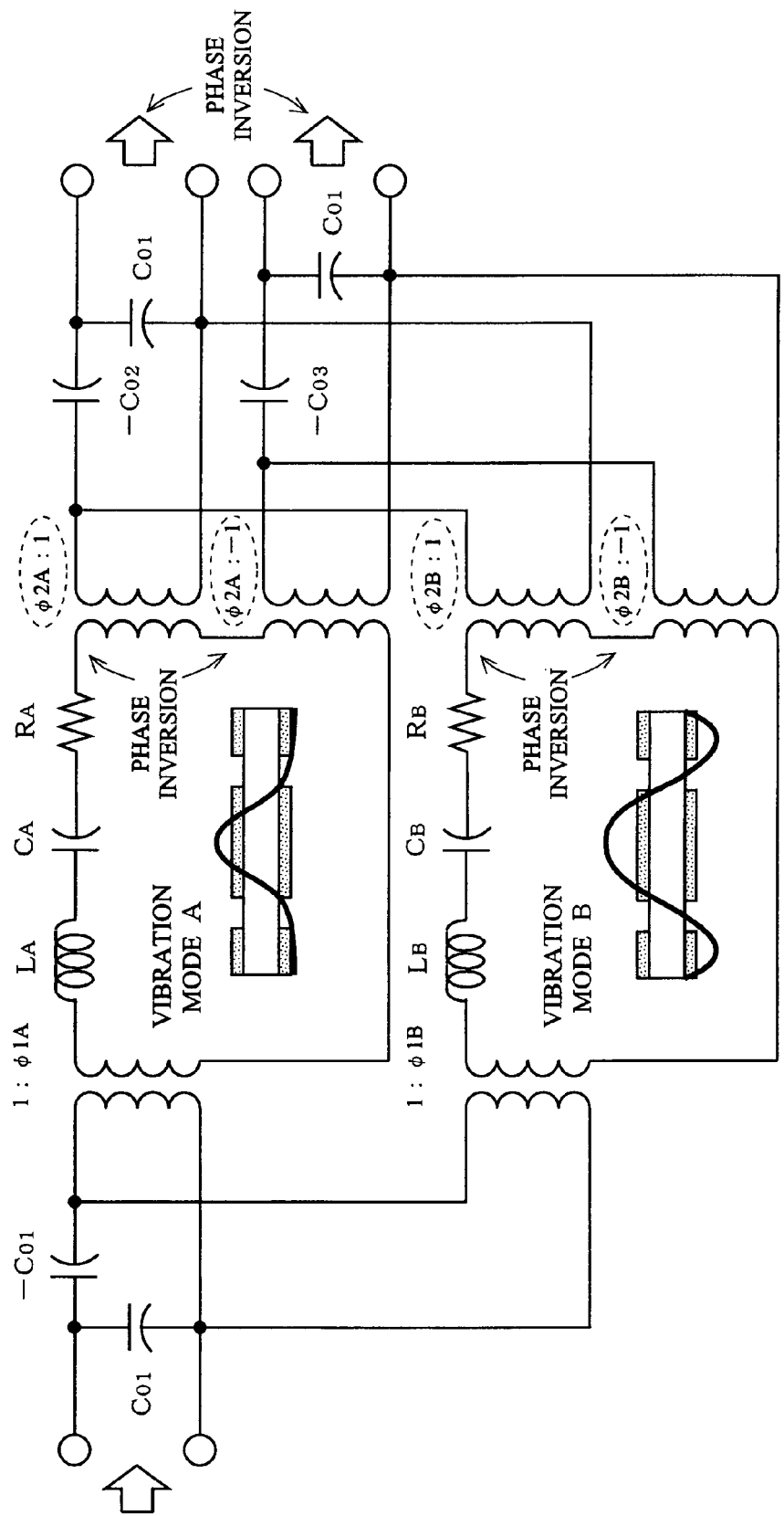
FIG. 4 is a diagram of an equivalent circuit of the thin film elastic wave resonator according to the first embodiment of the present invention.
Figure 5:
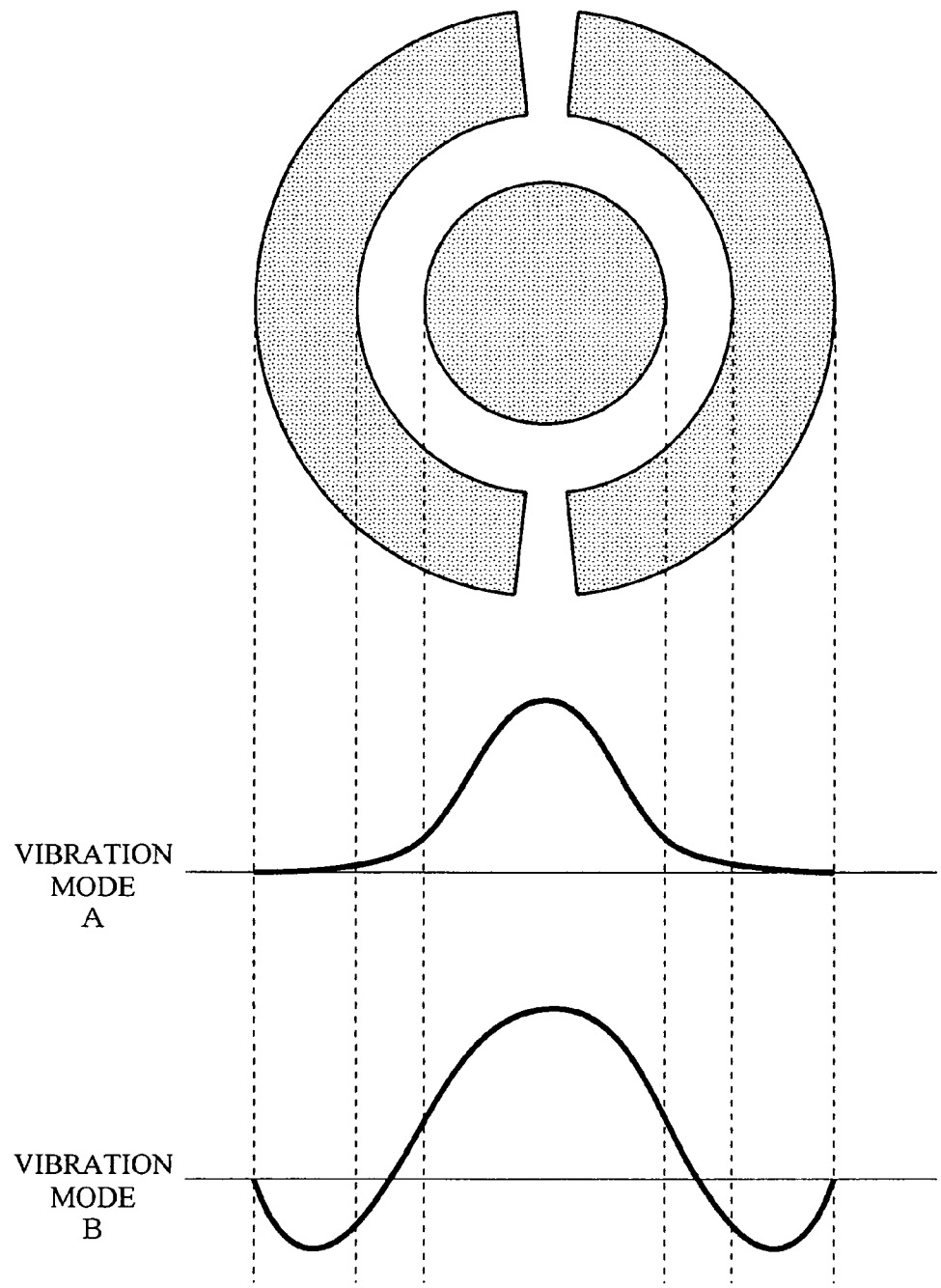
FIG. 5 is a diagram explaining two vibration modes generated by the thin film elastic wave resonator according to the first embodiment of the present invention.
Figure 6:
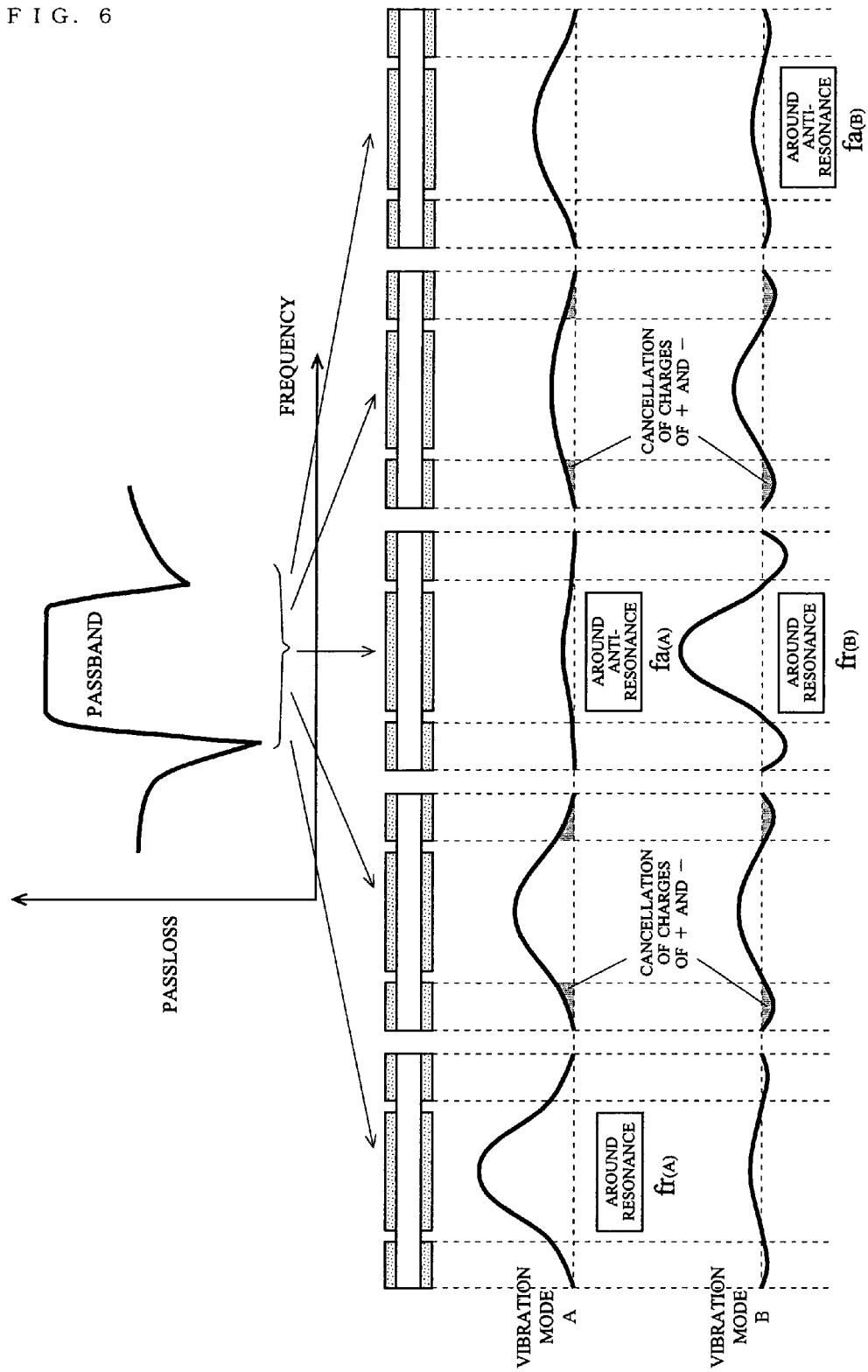
FIG. 6 is a diagram explaining a principle that a band-pass filter is structured by the thin film elastic wave resonator according to the first embodiment of the present invention.

Next, a principle that a band-pass filter having a balance-unbalance conversion function can be realized by the thin film elastic wave resonator 1 according to the first embodiment will be described. FIG. 4 is a diagram showing an equivalent circuit of the thin film elastic wave resonator 1 according to the first embodiment. FIG. 5 is a diagram explaining two vibration modes generated in the thin film elastic wave resonator 1 according to the first embodiment. FIG. 6 is a diagram explaining the principle that by using the two vibration modes shown in FIG. 5, the band-pass filter can be structured by the thin film elastic wave resonator 1 according to the first embodiment.

An electrical signal for vibrating the thin film elastic wave resonator 1 is applied to the first electrode section 51 or the fourth electrode section 31. The applied electrical signal excites mechanical vibration due to an inverse piezoelectric effect. This excited vibration propagates through the piezoelectric body 40 and is transmitted to a region sandwiched by the second electrode section 52 and the fifth electrode section 32 and to a region sandwiched by the third electrode section 53 and the sixth electrode section 33, respectively. The propagated vibration is taken out from a space between the second electrode section 52 and the fifth electrode section 32 or a space between the third electrode section 53 and the fifth electrode section 32 after having been converted into electrical signals due to a piezoelectric effect. Here, since the space between the second electrode section 52 and the fifth electrode section 32 and the space between the third electrode section 53 and the sixth electrode section 33 operate with resonance of a frequency at which a thickness is basically equal to a half-wave length, the electrical signal outputted from the space between the second electrode section 52 and the sixth electrode section 33 or the electrical signal outputted from the space between the third electrode section 53 and the fifth electrode section 32 are ideally balance signals whose amplitudes are same as each other and whose phases are opposite to each other.

At this point, as described hereinunder, there exist two vibration modes, whose vibration patterns are different from each other, in the mechanical vibration excited by the first electrode section 51 and the fourth electrode section 31.

Electrical signals may be applied to the second electrode section 52 and the sixth electrode section 33 or to the third electrode section 53 and the fifth electrode section 32. In this case, the electrical signals are taken out from the first electrode section 51 and the fourth electrode section 31 in a manner opposite to the above-mentioned manner.

When a structure of the thin film elastic wave resonator 1 is represented by an equivalent circuit, as shown in FIG. 4, there exist two resonance circuits. These two resonance circuits vibrate in patterns, in accordance with positions of the electrodes, which are different from each other as described below. In a first pattern, a peak of positive vibration is at the center of the first electrode section 51 and the fourth electrode section 31 and positive vibration is generated at the second electrode section 52 and the fifth electrode section 32 as well as at the third electrode section 53 and the sixth electrode section 33 (vibration mode A in FIG. 5). In a second pattern, a peak of positive vibration is at the center of the first electrode section 51 and the fourth electrode section 31 and peaks of negative vibration are at the centers of widths of the second electrode section 52, the third electrode section 53, the fifth electrode section 32, and the sixth electrode section 33 (vibration mode B in FIG. 5). In other words, in the patterns, vibration is generated all between the first electrode section 51 and the fourth electrode section 31, between the second electrode section 52 and the fifth electrode section 32, and between the third electrode section 53 and the sixth electrode section 33.

In the vibration mode A, a charge generated by the vibration is maximum at a resonance frequency fr(A) and minimum at an anti-resonance frequency fa(A). On the other hand, in the vibration mode (B), a charge generated by the vibration is maximum at a resonance frequency fr(B) which is different from the resonance frequency fr(A) and minimum at an anti-resonance frequency fa(B) which is different from the anti-resonance frequency fa(A). Therefore, in a frequency region where the anti-resonance frequency fa(A) in the vibration mode A and the resonance frequency fr(B) in the vibration mode B approximate to each other, a pass loss in the thin film elastic wave resonator 1 is reduced and cancellation of a positive charge and a negative charge in both sides of the frequency region is observed, realizing characteristics of a filter having a wide passband as shown in FIG. 6.

In addition, when the respective electrodes and the piezoelectric body are set in an appropriate manner so that the anti-resonance frequency fa(A) in the vibration mode A and the resonance frequency fr(B) in the vibration mode B substantially coincide with each other, further reducing a loss in a passband is enabled, leading to a reduction in a loss in the thin film elastic wave resonator 1.

As described above, the thin film elastic wave resonator 1 according to the first embodiment of the present invention, having a structure of a stand-alone resonator, reduces an energy loss through enhancing a degree of mode coupling and realizes a band-pass filter having a wide passband. And by inputting and outputting electrical signals to and from the upper electrode and the lower electrode which are diagonally positioned (the second electrode section 52 and the sixth electrode section 33; and the third electrode section 53 and the fifth electrode section 32), balance conversion can be realized.

Figure 7:
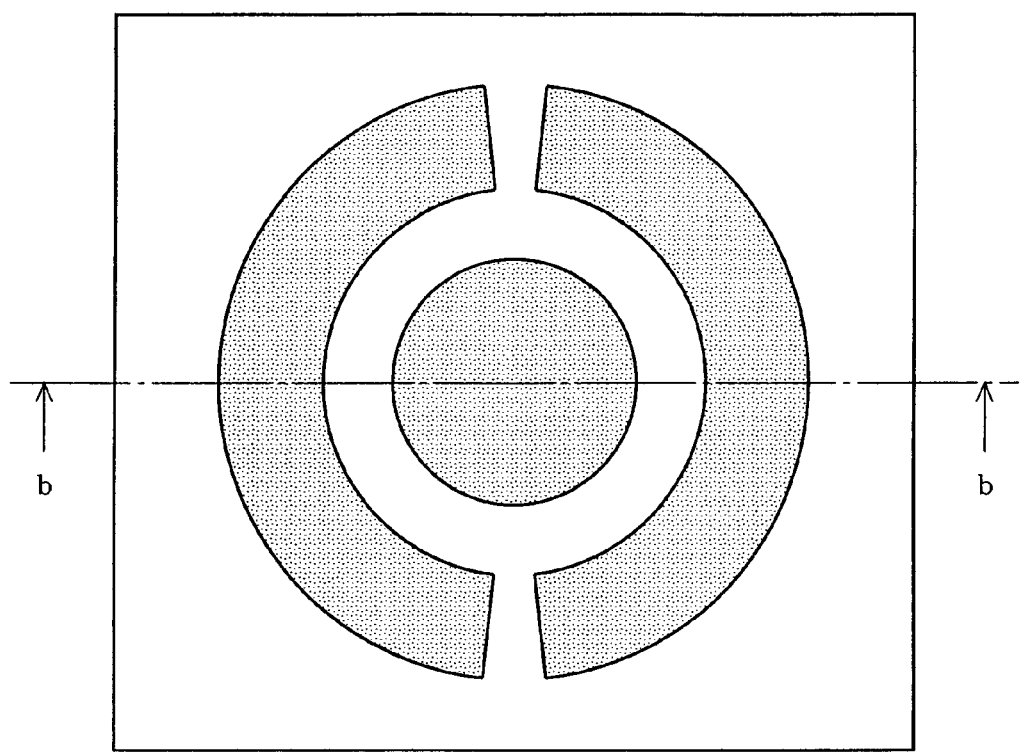
FIG. 7 is a structure diagram illustrating a top view of another thin film elastic wave resonator according to the first embodiment of the present invention.
Figure 8:
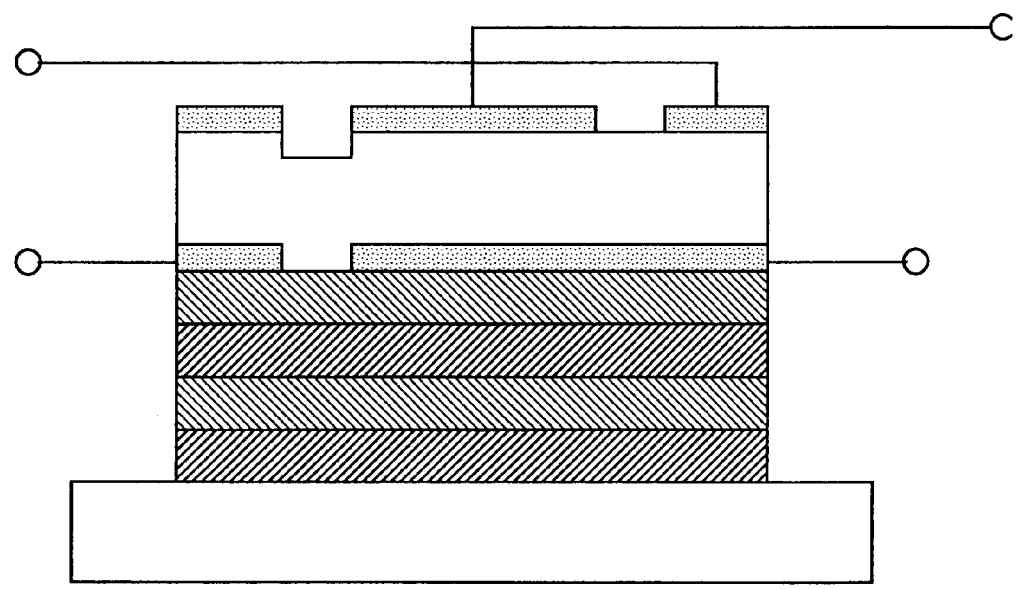
FIG. 8 is a structure diagram illustrating a cross-sectional view of said another thin film elastic wave resonator according to the first embodiment of the present invention (a cross-sectional view along a line b-b shown in FIG. 7).

In the first embodiment, although the example in which in the thin film elastic wave resonator 1, three sections such as the fourth electrode section 31, the fifth electrode section 32, and the sixth electrode section 33 are formed in the lower electrode 30 is described, as shown in FIGS. 7 and 8, two electrode sections may be formed in the lower electrode 30. The thin film elastic wave resonator having such a structure can exhibit similar effect to that described above.

Second Embodiment

Figure 9:
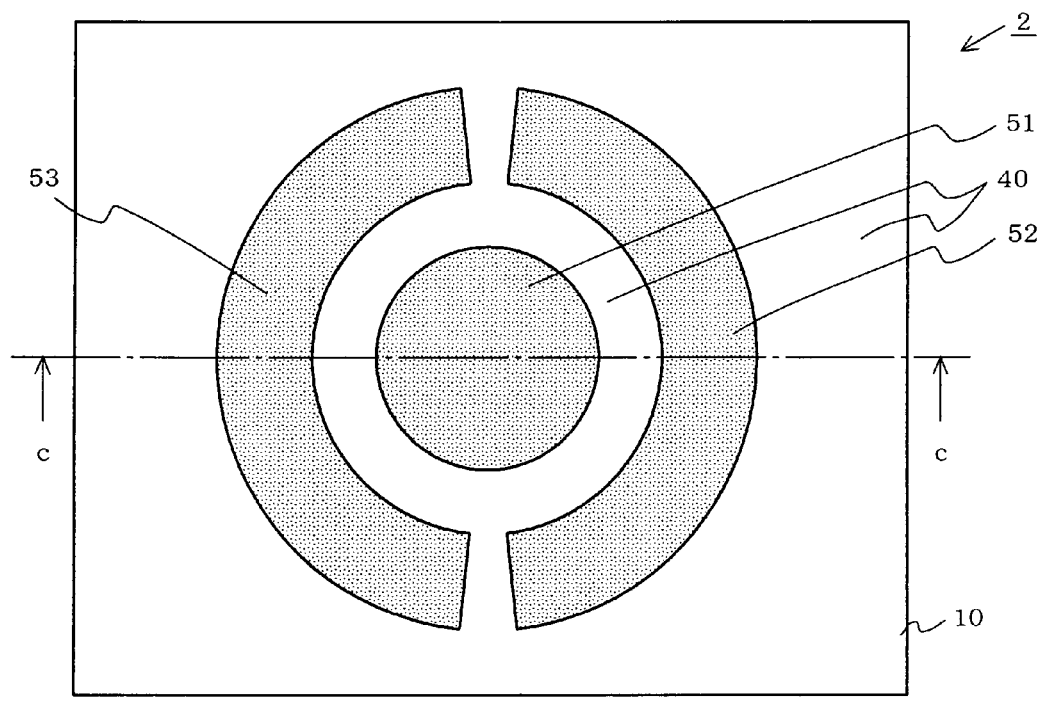
FIG. 9 is a structure diagram illustrating a top view of a thin film elastic wave resonator according to a second embodiment of the present invention.
Figure 10A:
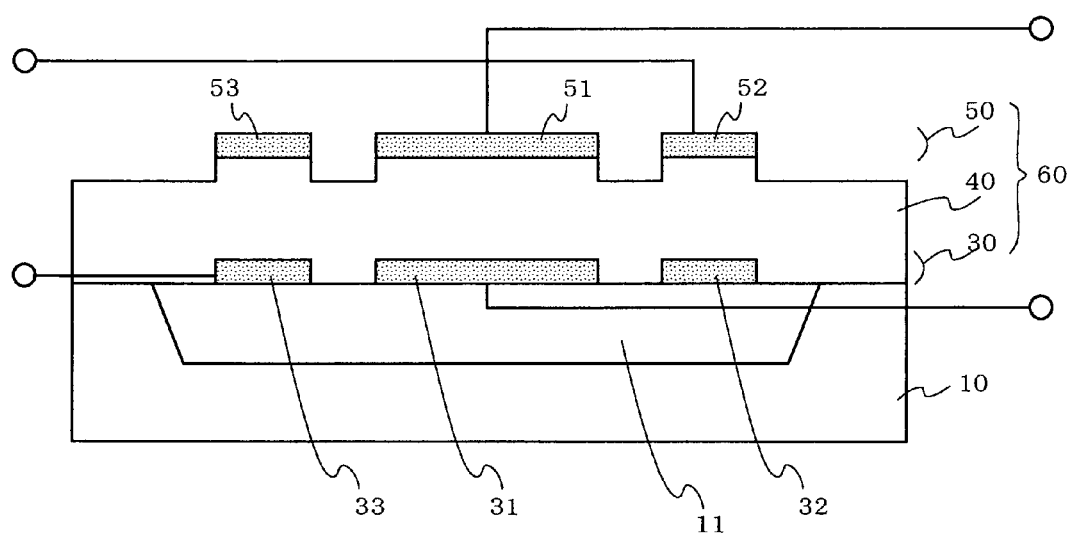
FIG. 10A is a structure diagram illustrating a cross-sectional view of the thin film elastic wave resonator according to the second embodiment of the present invention (a cross-sectional view along a line c-c shown in FIG. 9).

FIG. 9 is a diagram illustrating a top view of a constructional example of a thin film elastic wave resonator 2 according to a second embodiment of the present invention. FIG. 10A is a diagram illustrating a cross-sectional view of the thin film elastic wave resonator 2 shown in FIG. 9 along a line c-c. In FIGS. 9 and 10A, the thin film elastic wave resonator 2 according to the second embodiment has a structure in which a lower electrode 30, a piezoelectric body 40, and an upper electrode 50 are formed in order on a semiconductor substrate 10 having a cavity 11 formed therein. A vibration section 60 includes the lower electrode 30, the piezoelectric body 40, and the upper electrode 50.

As shown in FIG. 10A, the thin film elastic wave resonator 2 according to the second embodiment has a structure in which the cavity 11, instead of the acoustic mirror 20 in the thin film elastic wave resonator 1 according to the above-described first embodiment, is provided in the semiconductor substrate 10. This cavity 11 is provided for containing resonant vibration of the vibration section 60 inside of the vibration section 60 similarly to the acoustic mirror 20.

Figure 10B:
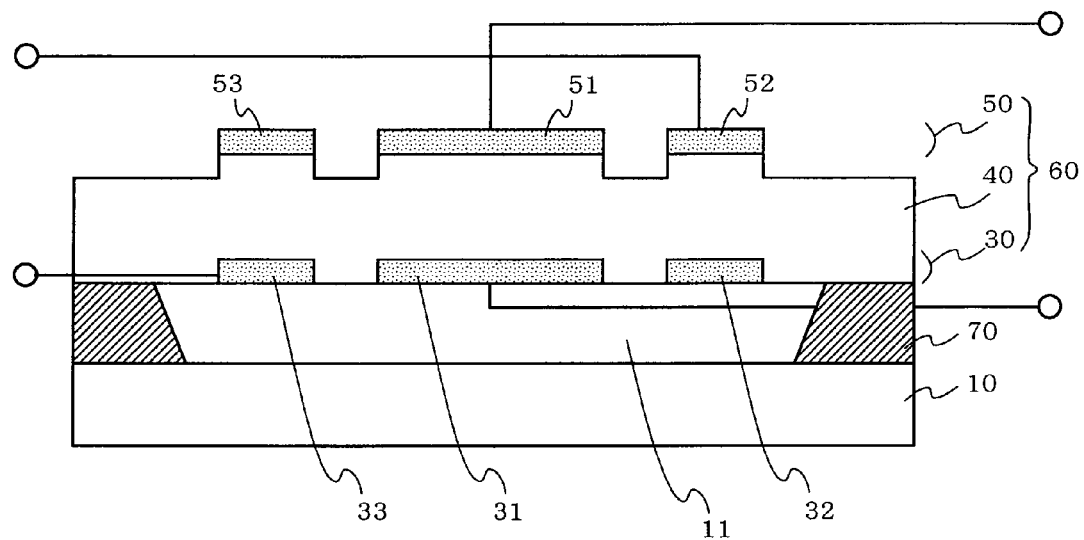
FIG. 10B is another structure diagram illustrating a cross-sectional view of the thin film elastic wave resonator according to the second embodiment of the present invention.

Therefore, similarly to the thin film elastic wave resonator 1 according to the first embodiment, the thin film elastic wave resonator 2 according to the second embodiment of the present invention, having a structure of a stand-alone resonator, reduces an energy loss through enhancing a degree of mode coupling and realizes a band-pass filter having a wide passband. And by inputting and outputting electrical signals to and from the upper electrode and the lower electrode which are diagonally positioned, balance conversion can be realized. Although in FIG. 10A, the cavity 11 formed through conducting etching or the like and caving in a part of the semiconductor substrate 10 is shown, as shown in FIG. 10B, the cavity 11 may be formed by laminating a supporting layer 70 on the semiconductor substrate 10.

Figure 11:
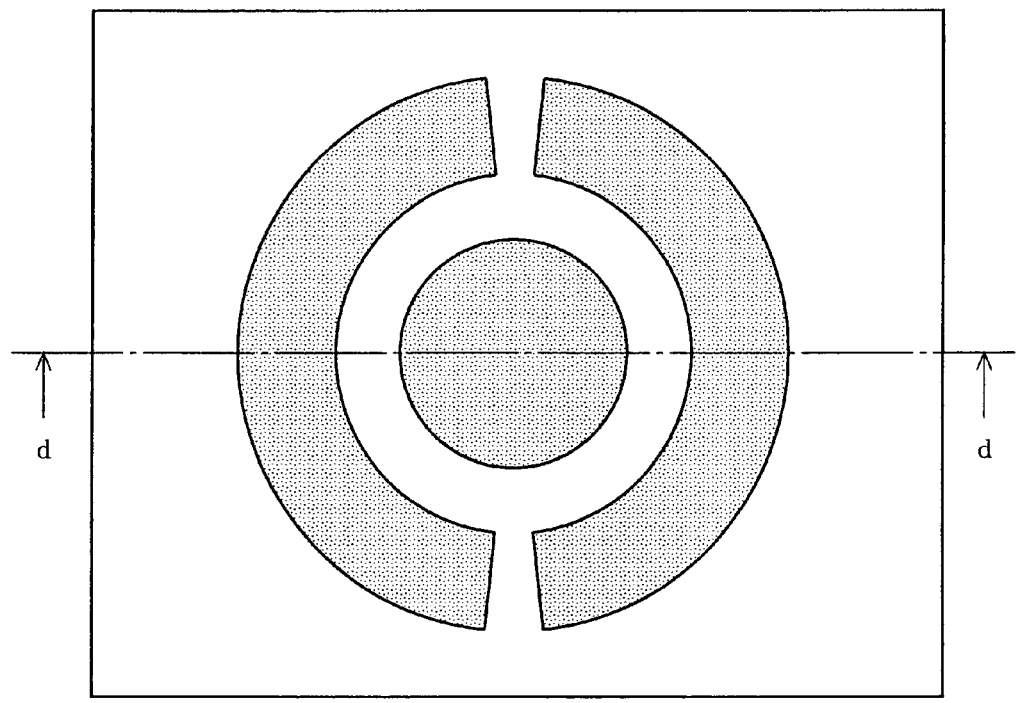
FIG. 11 is a structure diagram illustrating a top view of another thin film elastic wave resonator according to the second embodiment of the present invention.
Figure 12A:
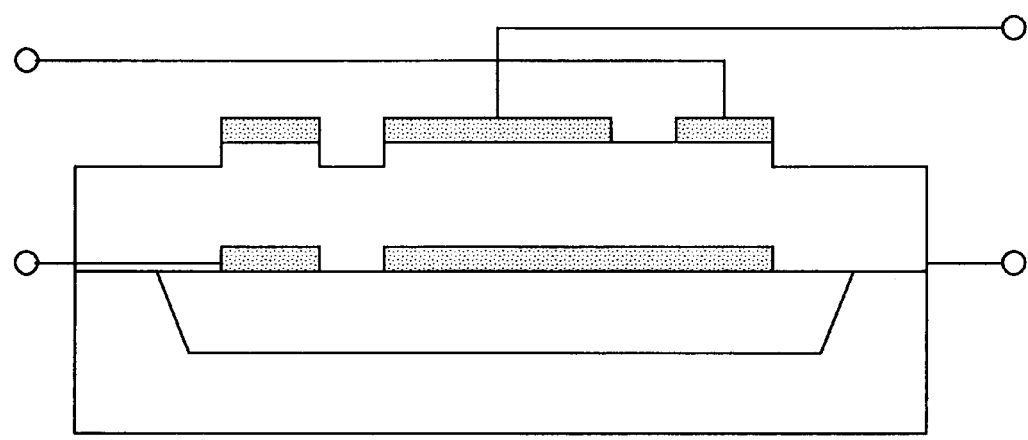
FIG. 12A is a structure diagram illustrating a cross-sectional view of said another thin film elastic wave resonator according to the second embodiment of the present invention (a cross-sectional view along a lined-d shown in FIG. 11).
Figure 12B:
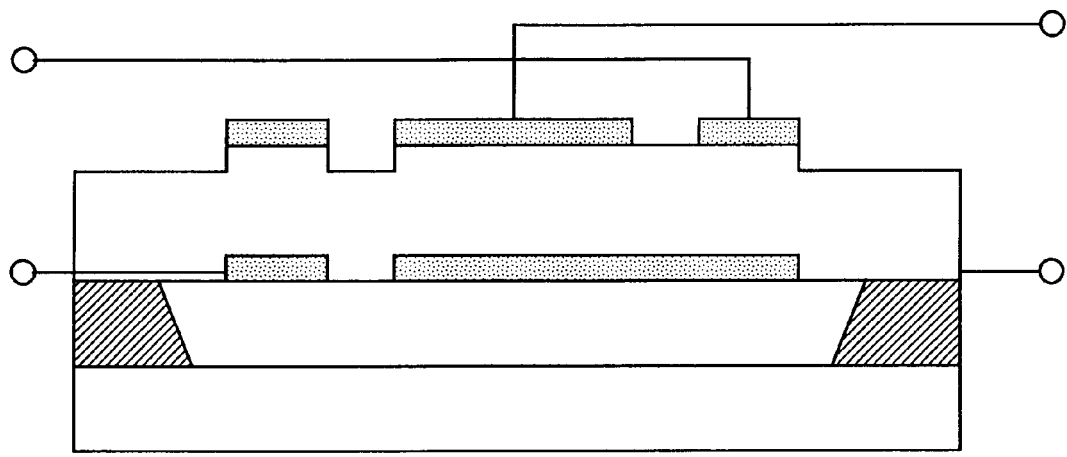
FIG. 12B is another structure diagram illustrating a cross-sectional view of another thin film elastic wave resonator according to the second embodiment of the present invention.

In the second embodiment, although the example in which in the thin film elastic wave resonator 2, three sections such as the fourth electrode section 31, the fifth electrode section 32, and the sixth electrode section 33 are formed in the lower electrode 30 is described, as shown in FIGS. 11 and 12A, two electrode sections may be formed in the lower electrode 30. The thin film elastic wave resonator having such a structure can exhibit similar effect to that described above. Also in this structure, the cavity may be formed by laminating a supporting layer on the semiconductor substrate as shown in FIG. 12B.

Third Embodiment

Figure 13:
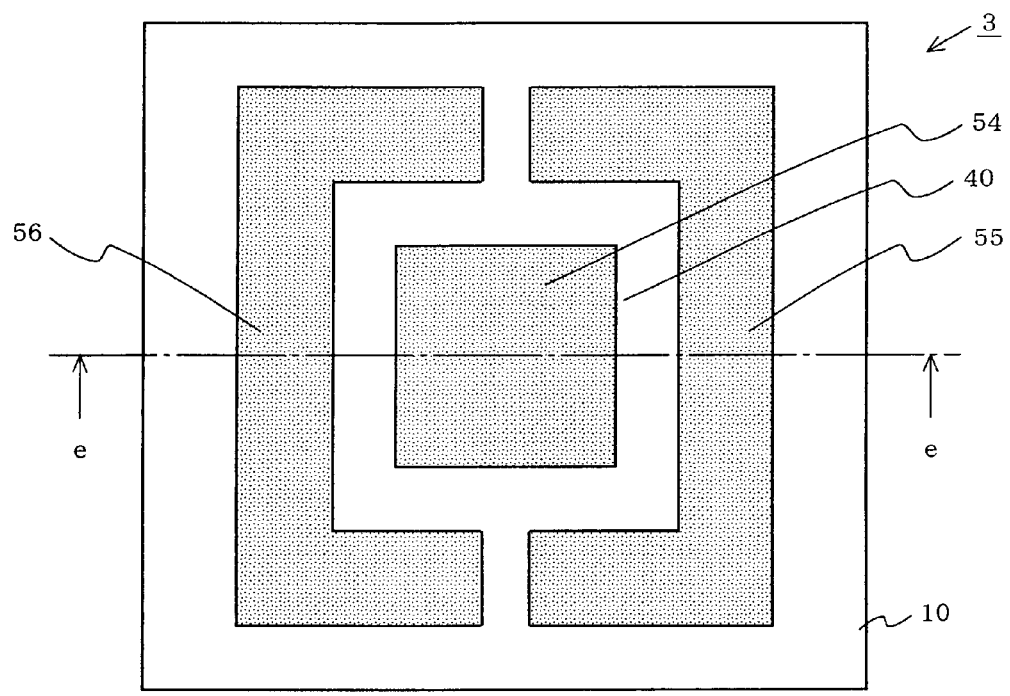
FIG. 13 is a structure diagram illustrating a top view of a thin film elastic wave resonator according to a third embodiment of the present invention.
Figure 14:
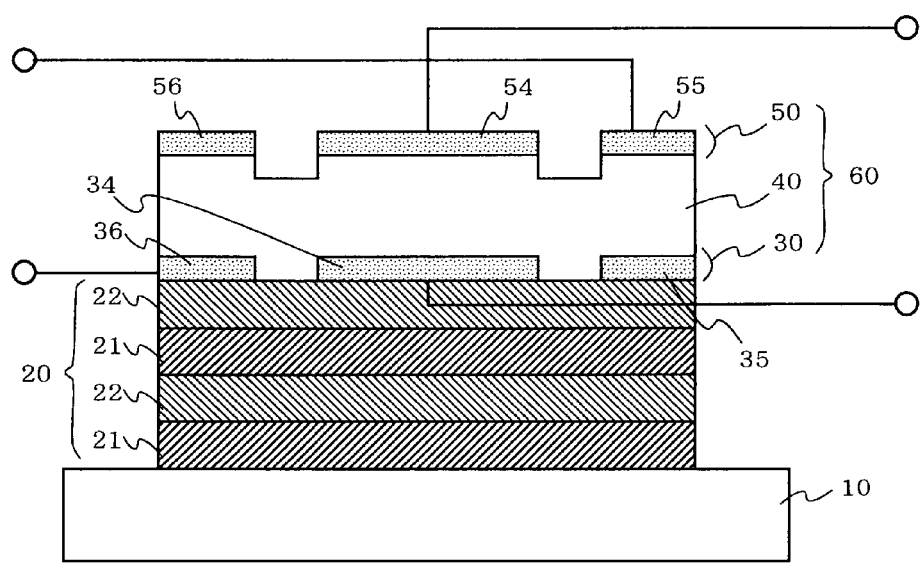
FIG. 14 is a structure diagram illustrating a cross-sectional view of the thin film elastic wave resonator according to the third embodiment of the present invention (a cross-sectional view along a line e-e shown in FIG. 13).

FIG. 13 is a diagram illustrating a top view of a constructional example of a thin film elastic wave resonator 3 according to a third embodiment of the present invention. FIG. 14 is a diagram illustrating a cross-sectional view of the thin film elastic wave resonator 3 shown in FIG. 13 along a line e-e. In FIGS. 13 and 14, the thin film elastic wave resonator 3 according to the third embodiment has a structure in which an acoustic mirror 20, a lower electrode 30, a piezoelectric body 40, and an upper electrode 50 are formed in order on a semiconductor substrate 10. Although this structure is same as that of the thin film elastic wave resonator 1 according to the above-described first embodiment, shapes of electrodes formed in the lower electrode 30 and the upper electrode 50 are different from those in the first embodiment as follows.

The upper electrode 50 includes a first electrode section 54 formed in a polygonal manner and a second electrode section 55 and a third electrode section 56 formed in a polygonal manner outside of the first electrode section 54. The first electrode section 54, the second electrode section 55, and the third electrode section 56 are electrically separated from one another via an insulating region. As shown in FIG. 13, each of the second electrode section 55 and the third electrode section 56 is of a polygonal shape formed by connected inner sides, connected outer sides, and two lines connecting the connected inner sides and the connected outer sides. Shapes (multi-sided figures) formed by the outer sides of the second electrode section 55, the outer sides of the third electrode section 56, and lines connecting the outer sides of the second electrode section 55 and the outer sides of the third electrode section 56 at the insulating region; and formed by the inner sides of the second electrode section 55, the inner sides of the third electrode section 56, and lines connecting the inner sides of the second electrode section 55 and the inner sides of the third electrode section 56 at the insulating region are similar to a polygonal shape formed by sides of the first electrode section 54. Here, it is favorable that centers of the multi-sided figures coincide with a center of the first electrode section 54. And it is favorable that a clearance between the first electrode section 54 and the second electrode section 55 and a clearance between the first electrode section 54 and the third electrode section 56 are equal to or greater than a thickness of the piezoelectric body 40. FIG. 13 is a diagram showing an example in which the polygonal shape of the first electrode section 54 is of a square.

Similarly, the lower electrode 30 includes a fourth electrode section 34 formed in a polygonal manner and a fifth electrode section 35 and a sixth electrode section 36 formed in a polygonal manner outside of the fourth electrode section 34. The fourth electrode section 34, the fifth electrode section 35, and the sixth electrode section 36 are electrically separated from one another via an insulating region. Each of the fifth electrode section 35 and the sixth electrode section 36 is a polygonal shape formed by connected inner sides, connected outer sides, and two lines connecting the connected inner sides and the connected outer sides. Shapes (multi-sided figures) formed by the outer sides of the fifth electrode section 35, the outer sides of the sixth electrode section 36, and lines connecting the outer sides of the fifth electrode section 35 and the outer sides of the sixth electrode section 36 at the insulating region; and formed by the inner sides of the fifth electrode section 35, the inner sides of the sixth electrode section 36, and lines connecting the inner sides of the fifth electrode section 35 and the inner sides of the sixth electrode section 36 at the insulating region are similar to a polygonal shape formed by sides of the fourth electrode section 34. Here, it is favorable that centers of the multi-sided figures coincide with a center of the fourth electrode section 34. And it is favorable that a clearance between the fourth electrode section 34 and the fifth electrode section 35 and a clearance between the fourth electrode section 34 and the sixth electrode section 36 are equal to or greater than a thickness of the piezoelectric body 40. In consideration of characteristics, it is most favorable that the fourth electrode section 34 is provided so as to face the first electrode section 54 via the piezoelectric body 40, the fifth electrode section 35 is provided so as to face the second electrode section 36 via the piezoelectric body 40, and the sixth electrode section 36 is provided so as to face the third electrode section 56 via the piezoelectric body 40, respectively.

Figure 15:
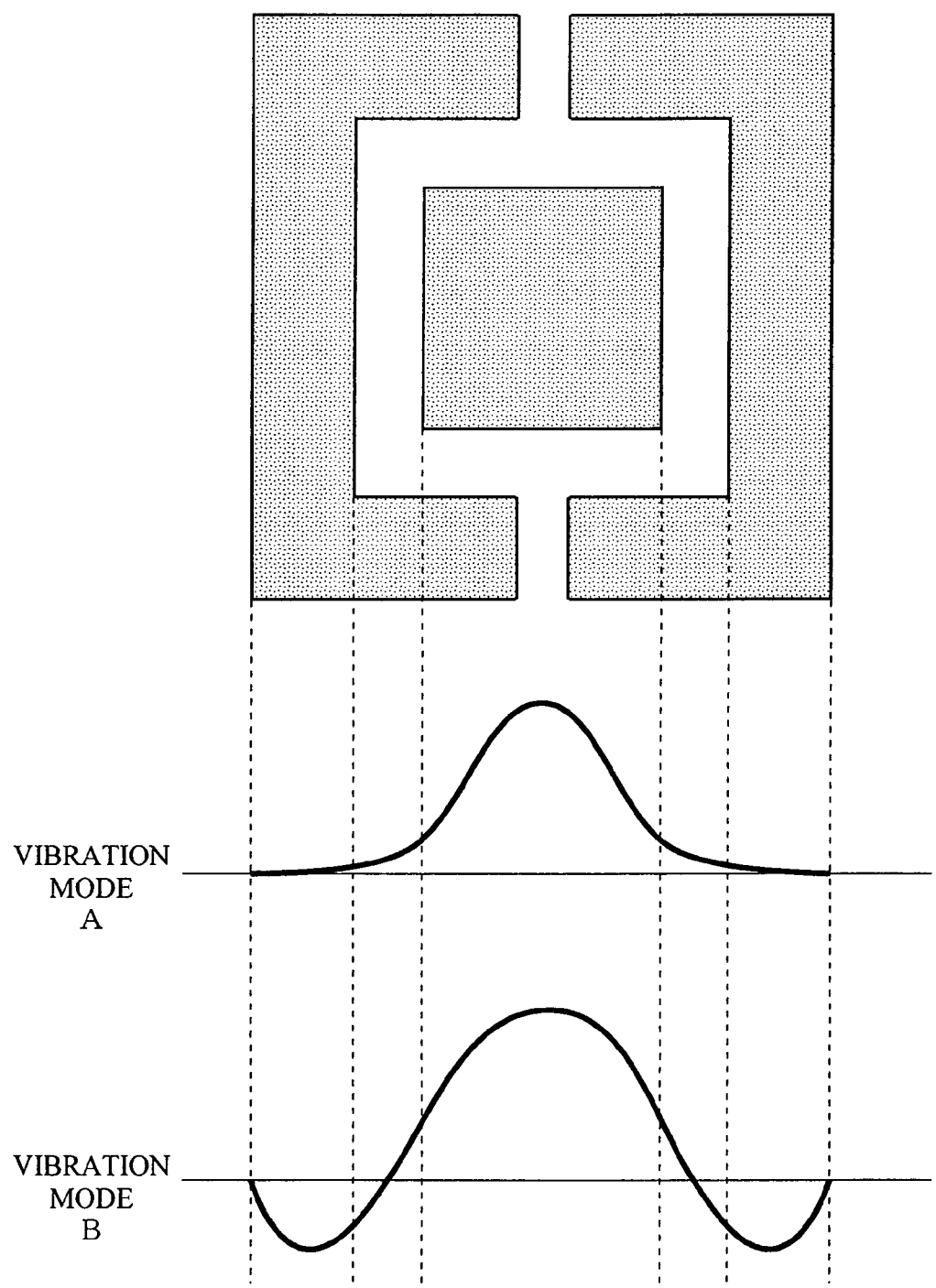
FIG. 15 is a diagram explaining two vibration modes generated by the thin film elastic wave resonator according to the third embodiment of the present invention.

In the thin film elastic wave resonator 3, having the above-described structure, according to the third embodiment, when electrical signals are applied between the first electrode section 54 and the fourth electrode section 34 (or between the second electrode section 55 and the sixth electrode section 36, or between the third electrode section 56 and the fifth electrode section 35), as shown in FIG. 15, vibration in a vibration mode A and a vibration mode B whose vibration patterns are different from each other is generated. Therefore, when the respective electrodes and the piezoelectric body are set in an appropriate manner so that an anti-resonance frequency fa(A) in the vibration mode A and a resonance frequency fr(B) in the vibration mode B substantially coincide with each other, characteristics of a filter having a wide passband can be realized (see FIG. 6).

As described above, the thin film elastic wave resonator 3 according to the third embodiment of the present invention, having a structure of a stand-alone resonator, reduces an energy loss through enhancing a degree of mode coupling and realizes a band-pass filter having a wide passband. And by inputting and outputting electrical signals to and from the upper electrode and the lower electrode which are diagonally positioned, balance conversion can be realized.

Fourth Embodiment

Figure 16:
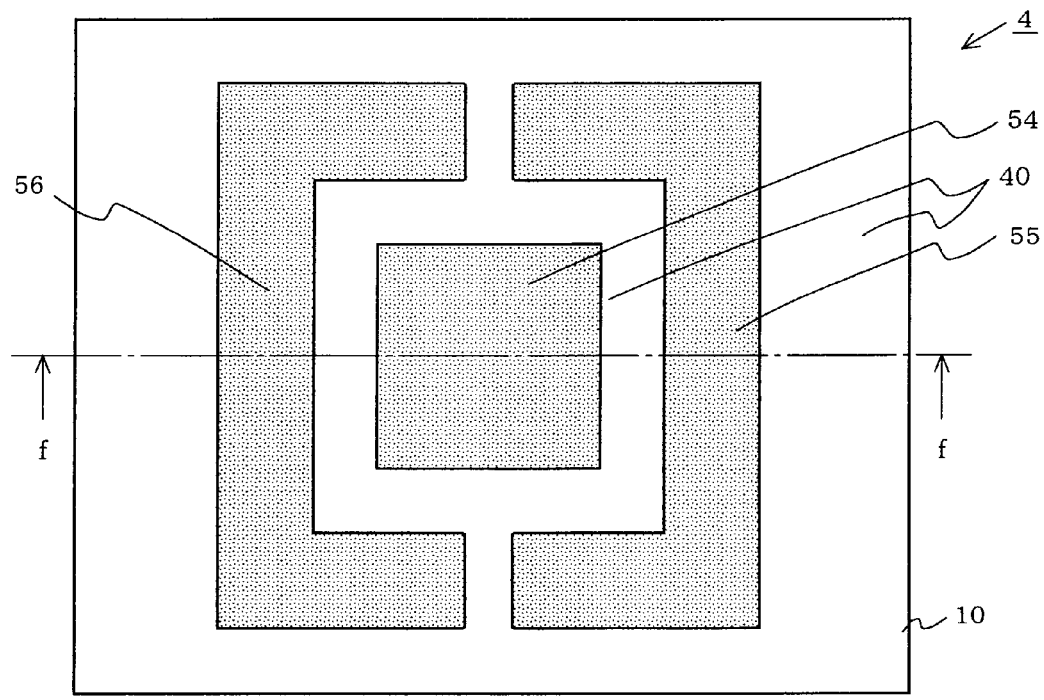
FIG. 16 is a structure diagram illustrating a top view of a thin film elastic wave resonator according to a fourth embodiment of the present invention.
Figure 17A:
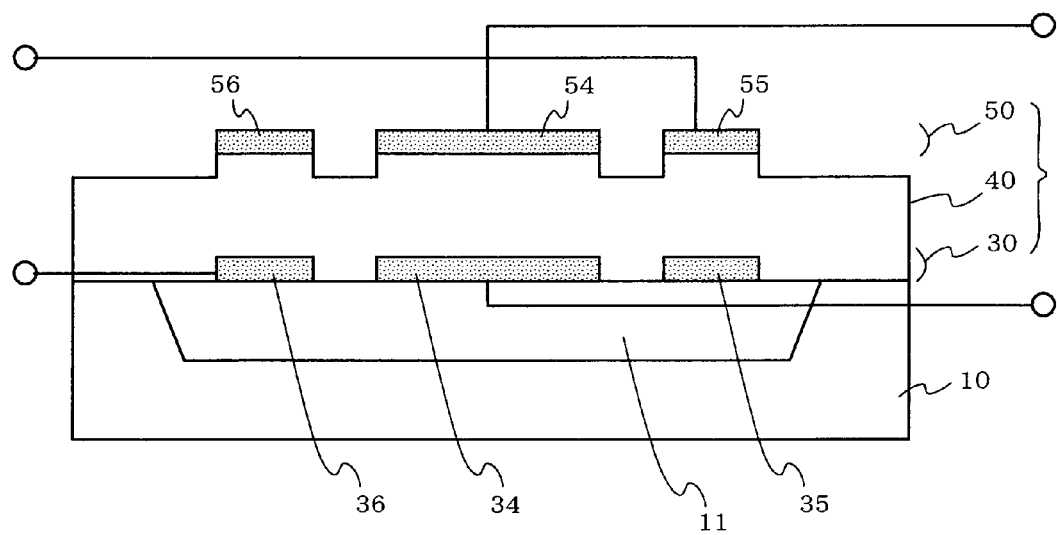
FIG. 17A is a structure diagram illustrating a cross-sectional view of the thin film elastic wave resonator according to the fourth embodiment of the present invention (a cross-sectional view along a line f-f shown in FIG. 16).

FIG. 16 is a diagram illustrating a top view of a constructional example of a thin film elastic wave resonator 4 according to a fourth embodiment of the present invention. FIG. 17A is a diagram illustrating a cross-sectional view of the thin film elastic wave resonator 4 shown in FIG. 16 along a line f-f. In FIGS. 16 and 17A, the thin film elastic wave resonator 4 according to the fourth embodiment has a structure in which a lower electrode 30, a piezoelectric body 40, and an upper electrode 50 are formed in order on a semiconductor substrate 10 having a cavity 11 formed therein. A vibration section 60 includes the lower electrode 30, the piezoelectric body 40, and the upper electrode 50.

As shown in FIG. 17A, the thin film elastic wave resonator 4 according to the fourth embodiment has a structure in which the cavity 11, instead of the acoustic mirror 20 in the thin film elastic wave resonator 3 according to the above-described third embodiment, is provided in the semiconductor substrate 10. This cavity 11 is provided for containing resonant vibration of the vibration section 60 inside of the vibration section 60 similarly to the acoustic mirror 20.

Figure 17B:
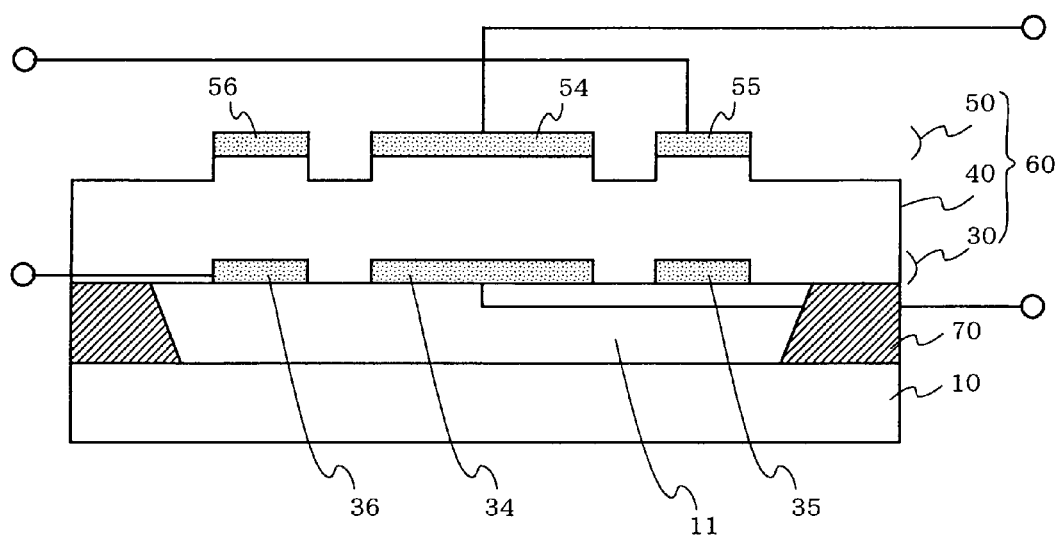
FIG. 17B is another structure diagram illustrating a cross-sectional view of the thin film elastic wave resonator according to the fourth embodiment of the present invention.

Therefore, similarly to the thin film elastic wave resonator 3 according to the third embodiment, the thin film elastic wave resonator 4 according to the fourth embodiment of the present invention, having a structure of a stand-alone resonator, reduces an energy loss through enhancing a degree of mode coupling and realizes a band-pass filter having a wide passband. And by inputting and outputting electrical signals to and from the upper electrode and the lower electrode which are diagonally positioned, balance conversion can be realized. Although in FIG. 17A, the cavity 11 formed through conducting etching or the like and caving in a part of the semiconductor substrate 10 is shown, as shown in FIG. 17B, the cavity 11 may be formed by laminating a supporting layer 70 on the semiconductor substrate 10.

Figure 18:
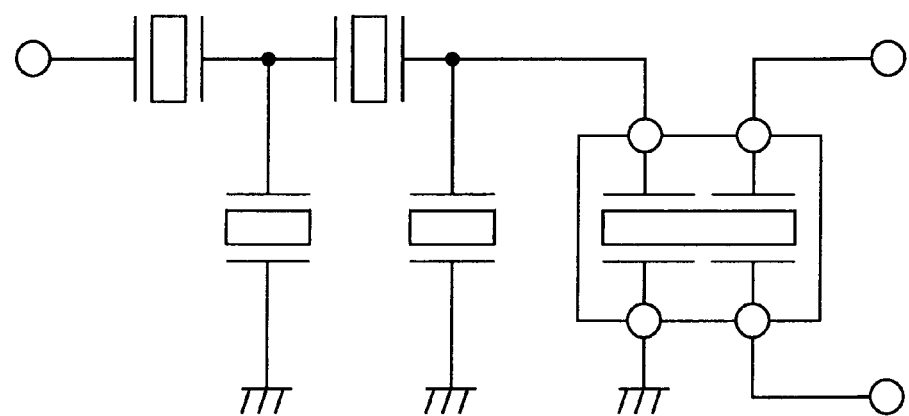
FIG. 18 is a diagram illustrating a constructional example of a ladder-type filter using the thin film elastic wave resonator of the present invention.

As described above, although each of the thin film elastic wave resonators 1 to 4 can be used as a stand-alone filter, the thin film elastic wave resonators 1 to 4 can also be used arbitrarily being combined with other thin film elastic wave resonator. For example, as shown in FIG. 18, each of the thin film elastic wave resonators 1 to 4 can be inserted at the most downstream of a ladder-type filter.

Figure 19:
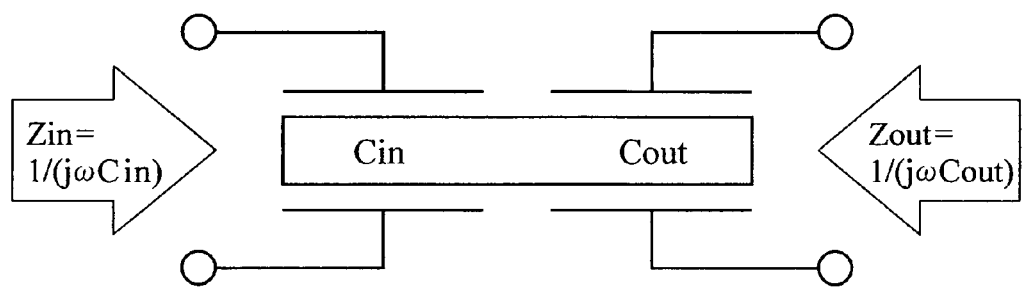
FIG. 19 is a diagram explaining impedance conversion using the thin film elastic wave resonator of the present invention.

In addition, since each of the thin film elastic wave resonators 1 to 4 of the present invention has a structure in which an inputted electrical signal is converted into vibration once and thereafter, the vibration is reconverted into an electrical signal to be taken out, it is also possible to perform impedance conversion by changing a capacitance value Cin on an input end and a capacitance value Cout on an output end (see FIG. 19). A capacitance value C can be obtained by using an equation $C=\epsilon S/t$, where $\epsilon$ represents permittivity, S represents an area of an electrode, and t represents a thickness of an piezoelectric body.

Figure 20:
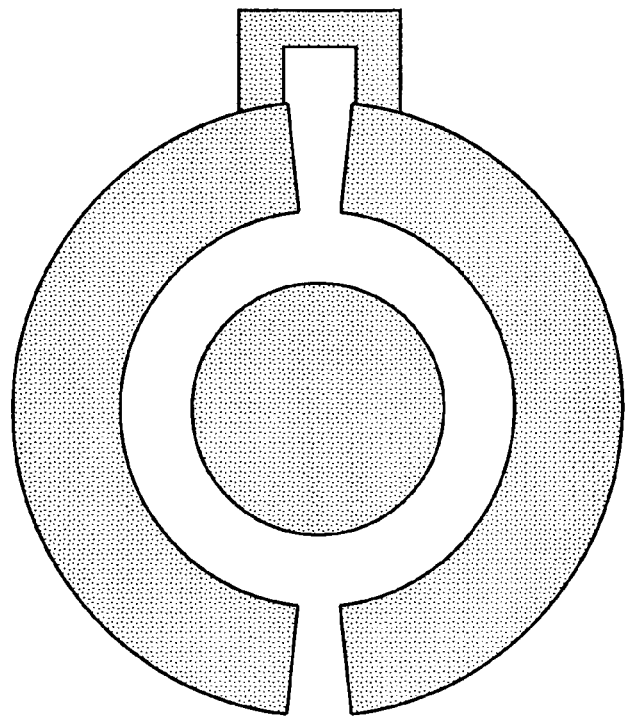
FIG. 20 is a diagram showing an example of connection of a second electrode section and a third electrode section.
Figure 20:
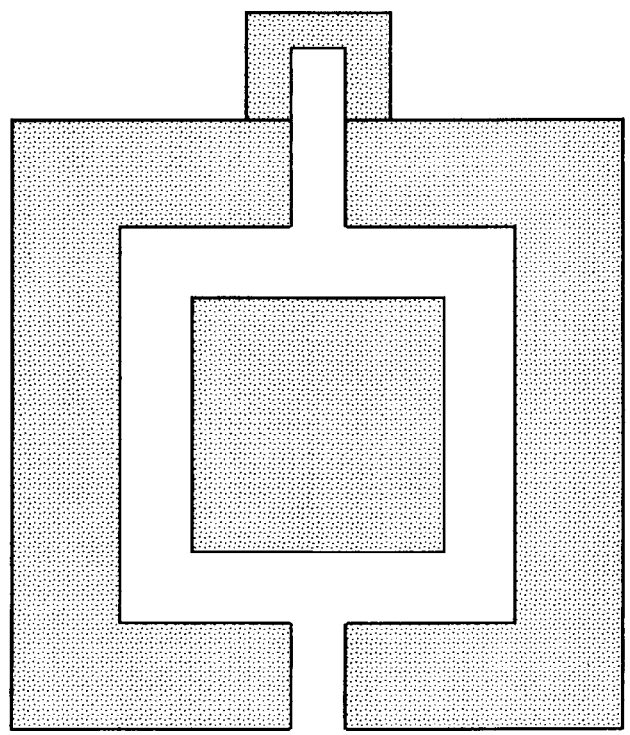

In addition, as described in the above first, second, third, and fourth embodiments, in consideration of characteristics, it is most favorable that in the thin film elastic wave resonator of the present invention, the second electrode section is isolated from the third electrode section and the fifth electrode section is isolated from the sixth electrode section, respectively. However, by using wires shown in FIG. 20, the second electrode section may be connected with the third electrode section and the fifth electrode section may be connected with the sixth electrode section, respectively.

Figure 21:
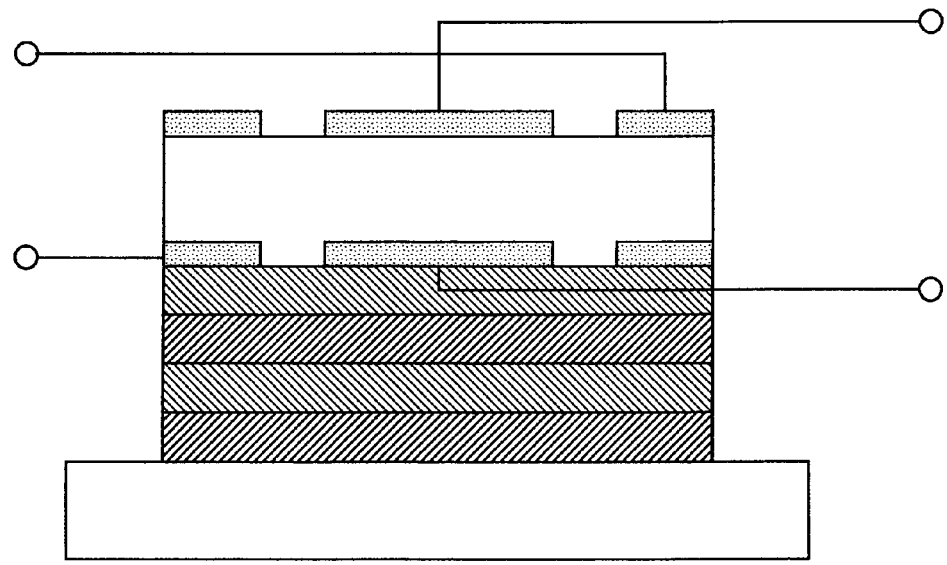
FIG. 21 is a structure diagram illustrating a cross-sectional view of the thin film elastic wave resonator in a case where the thin film elastic wave resonator of the first, second, third, or fourth embodiments of the present invention is applied.

Further, in the above-described first, second, third, and fourth embodiments, since the piezoelectric body 40 which is sandwiched by the lower electrode 30 and the upper electrode 50 is film-formed in a stand-alone manner, a thickness of the piezoelectric body is constant. As a result, an upper surface of the piezoelectric body 40 is depressed by a thickness of the lower electrode 30 between the first electrode section and the third electrode section. However, for example, by using a planarizing process such as CMP (Chemical Mechanical Polishing), as shown in FIG. 21, it is also possible to make flat the upper surface of the piezoelectric body 40. In this case, since resonance frequencies at the first electrode section, at the third electrode section, and at a portion between the first electrode section and the third electrode section approximate to one another, an advantage in use, such as facilitated excitation of desired vibration (in a vibration mode A and a vibration mode B), is great.

EMBODIMENT OF COMMUNICATION DEVICE USING THIN FILM ELASTIC WAVE RESONATOR

Figure 22:
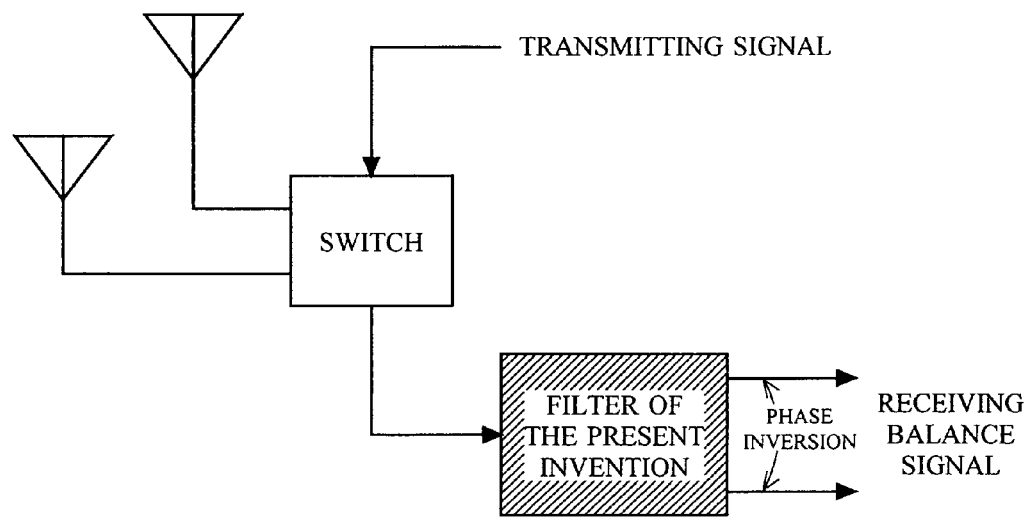
FIG. 22 is a diagram illustrating a constructional example of a communication device using the thin film elastic wave resonator of the present invention.
Figure 23:
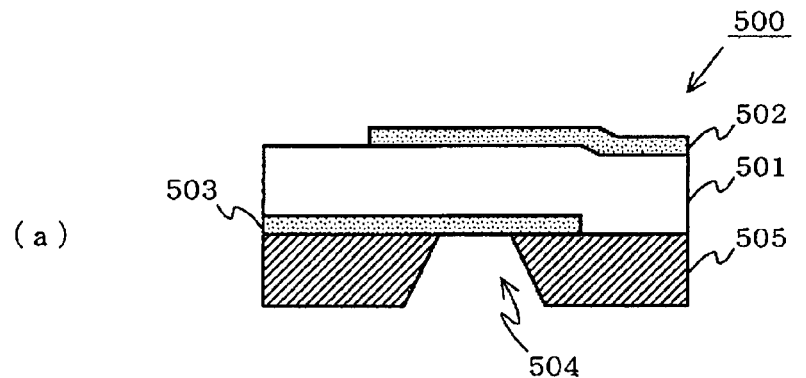
FIG. 23 is a diagram explaining a conventional thin film elastic wave resonator.
Figure 23:
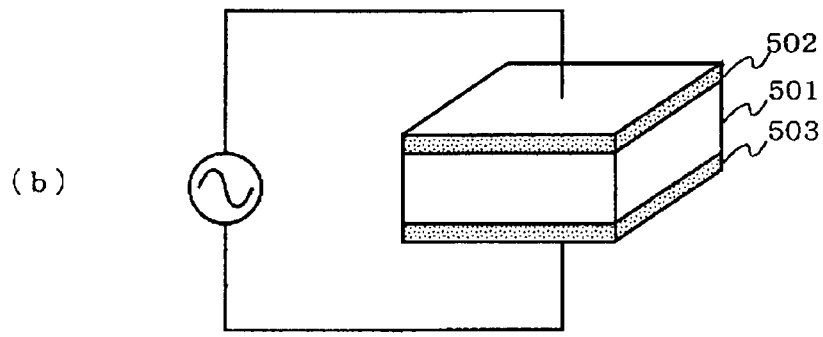
Figure 23:
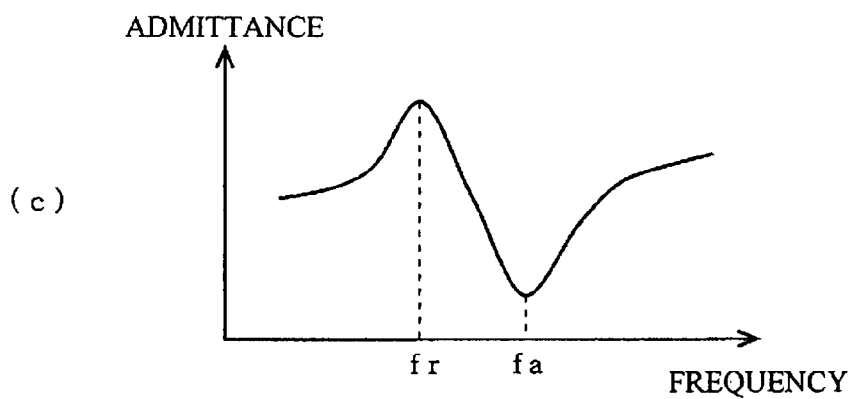
Figure 23:
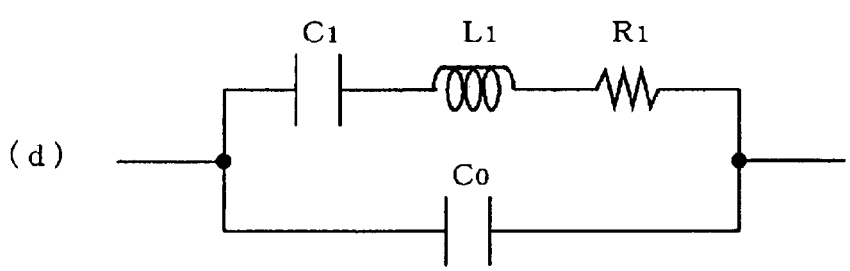
Figure 24:
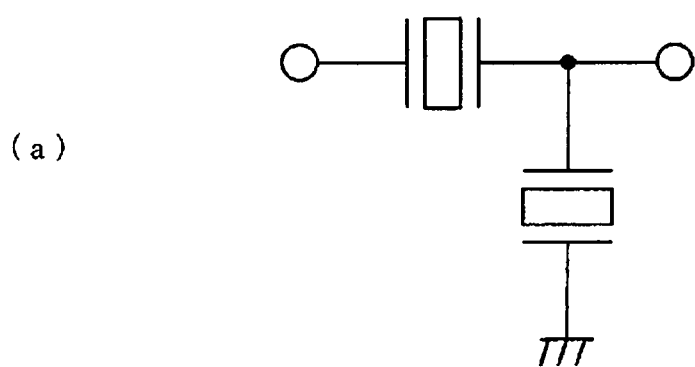
FIG. 24 is a structure diagram illustrating a filter using the conventional thin film elastic wave resonator.
Figure 24:
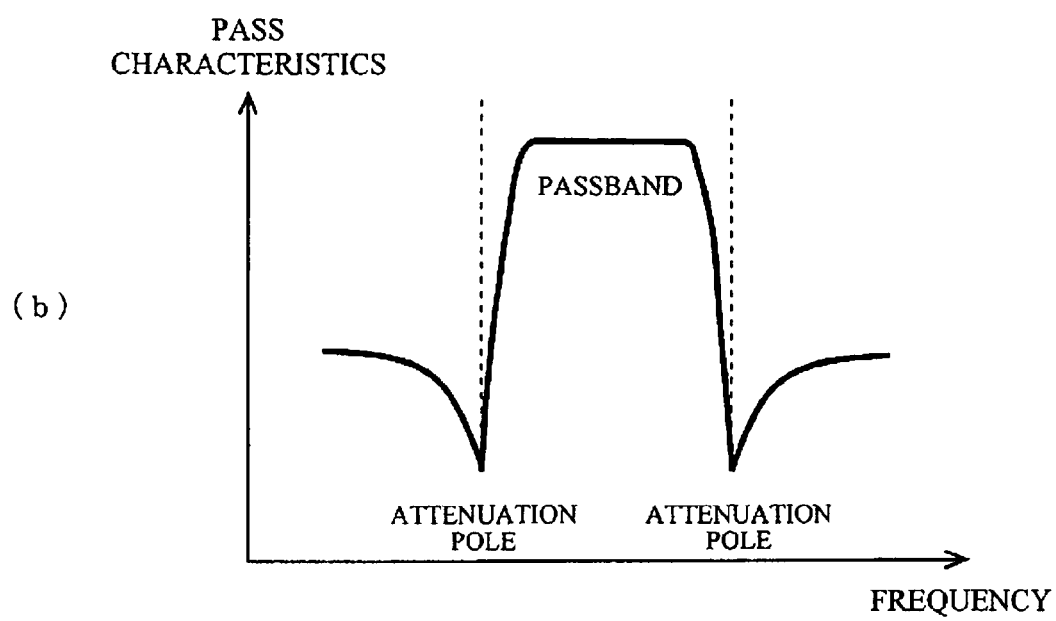

FIG. 22 is a diagram showing a constructional example of a communication device using a thin film elastic wave resonator of the present invention. In the communication device shown in FIG. 22, any of the thin film elastic wave resonators 1 to 4 described in the first, second, third, and fourth embodiments is used as a filter. This communication device comprises at least antennas, a switch element or a duplexer for switching a frequency between transmission and reception, and a filter which converts an unbalance signal to a balance signal and has a filtering function.

INDUSTRIAL APPLICABILITY

The thin film elastic wave resonator of the present invention is applicable, for example, when it is desired that a band-pass filter which reduces an energy loss and has a wide passband is realized in a stand-alone manner.

The invention claimed is:

1. A thin film elastic wave resonator which vibrates at a predetermined frequency, comprising:
 a piezoelectric body;
 a first electrode section formed on one surface of the piezoelectric body;
 a second electrode section which is formed so as to surround a periphery of the first electrode section, being positioned so as to be insulated from the first electrode section on said one surface of the piezoelectric body;
 a third electrode section which is formed so as to surround a periphery of the first electrode section, being positioned so as to be insulated from the first electrode section and the second electrode section on said one surface of the piezoelectric body;

a fourth electrode section formed on another surface of the piezoelectric body, which faces said one surface of the piezoelectric body;

a fifth electrode section which is formed so as to surround a periphery of the fourth electrode section, being positioned so as to be insulated from the fourth electrode section on said another surface of the piezoelectric body;

a sixth electrode section which is formed so as to surround a periphery of the fourth electrode section, being positioned so as to be insulated from the fourth electrode section and the fifth electrode section on said another surface of the piezoelectric body; and a supporting section, for supporting a structure formed by the piezoelectric body and the first to sixth electrode sections, which includes at least a substrate, wherein the first electrode section is surrounded by the second electrode section and the third electrode section, the fourth electrode section is surrounded by the fifth electrode section and the sixth electrode section, the first electrode section and the fourth electrode section are disposed so as to sandwich the piezoelectric body and face each other, the second electrode section and the fifth electrode section are disposed so as to sandwich the piezoelectric body and face each other, the third electrode section and the sixth electrode section are disposed so as to sandwich the piezoelectric body and face each other, and an electrical signal is inputted to one of the first electrode section and the fourth electrode section, and an electrical signal is outputted from either the second electrode section and the sixth electrode section or the third electrode section and the fifth electrode section; or an electrical signal is inputted to either the second electrode section and the sixth electrode section or the third electrode section and the fifth electrode section, and an electrical signal is outputted from one of the first electrode section and the fourth electrode section.

2. The thin film elastic wave resonator according to claim 1, wherein an area of the first electrode section is substantially equal to an area of the fourth electrode section, an area of the second electrode section is substantially equal to an area of the fifth electrode section, and an area of the third electrode section is substantially equal to an area of the sixth electrode section.

3. The thin film elastic wave resonator according to claim 2, wherein the second electrode section and the fifth electrode section are provided so as to be positioned symmetrically via the piezoelectric body, and the third electrode section and the sixth electrode section are provided so as to be positioned symmetrically via the piezoelectric body, respectively.

4. The thin film elastic wave resonator according to claim 1, wherein the first and fourth electrode sections are circular and the second, third, fifth, and sixth electrode sections are fan-shaped.

5. The thin film elastic wave resonator according to claim 2, wherein the first and fourth electrode sections are circular and the second, third, fifth, and sixth electrode sections are fan-shaped.

6. The thin film elastic wave resonator according to claim 1, wherein all of the first to sixth electrode sections are polygonal.

7. The thin film elastic wave resonator according to claim 2, wherein all of the first to sixth electrode sections are polygonal.

8. The thin film elastic wave resonator according to claim 1, wherein a center of the circular first electrode section coincides with centers of circles formed by arcs of the second and third electrode sections and a center of the circular fourth electrode section coincides with centers of circles formed by arcs of the fifth and sixth electrode sections.

9. The thin film elastic wave resonator according to claim 2, wherein a center of the circular first electrode section coincides with centers of circles formed by arcs of the second and third electrode sections and a center of the circular fourth electrode section coincides with centers of circles formed by arcs of the fifth and sixth electrode sections.

10. The thin film elastic wave resonator according to claim 1, wherein the supporting section is structured by a substrate having a cavity provided and the fourth to sixth electrode sections are disposed on the cavity.

11. The thin film elastic wave resonator according to claim 1, wherein the supporting section is structured by the substrate and a supporting layer laminated for forming the cavity on the substrate and the fourth to sixth electrode sections are disposed on the cavity.

12. The thin film elastic wave resonator according to claim 1, wherein the supporting section is structured by the substrate and an acoustic mirror formed by alternately laminating a layer in which an impedance is acoustically high and a layer in which an impedance is acoustically low, and the fourth to sixth electrode sections are disposed on the acoustic mirror.

13. The thin film elastic wave resonator according to claim 1, wherein a clearance between the first electrode section and the second electrode section and a clearance between the first electrode section and the third electrode section are equal to or greater than a thickness of the piezoelectric body.

14. A thin film elastic wave resonator which vibrates at a predetermined frequency, comprising:
    a piezoelectric body;
    a first electrode section formed on one surface of the piezoelectric body;
    a second electrode section which is formed outside of the first electrode section, being positioned so as to be insulated from the first electrode section, on said one surface of the piezoelectric body;
    a third electrode section which is formed outside of the first electrode section, being positioned so as to be insulated from the first electrode section and the second electrode section, on said one surface of the piezoelectric body;
    a fourth electrode section formed on another surface of the piezoelectric body, which faces said one surface of the piezoelectric body, so as to be positioned symmetrically with the first electrode section and the third electrode section;
    a fifth electrode section which is formed on said another surface of the piezoelectric body, being positioned so as to be insulated from the fourth electrode section and positioned symmetrically with the second electrode section; and
    a supporting section, for supporting a structure formed by the piezoelectric body and the first to fifth electrode sections, which includes at least a substrate, wherein
    an electrical signal is inputted to the first electrode section and an electrical signal is outputted from the third electrode section and the fifth electrode section ;or an electrical signal is inputted to the third electrode section and the fifth electrode section and an electrical signal is outputted from the first electrode section.

15. The thin film elastic wave resonator according to claim 14, wherein the first electrode section is circular and the second and third electrode sections are fan-shaped.

16. The thin film elastic wave resonator according to claim 14, wherein the first to third electrode sections are polygonal.

17. The thin film elastic wave resonator according to claim 14, wherein a center of the first electrode section coincides with centers of the second and third electrode sections.

18. The thin film elastic wave resonator according to claim 14, wherein the supporting section is structured by a substrate having a cavity provided and the fourth and fifth electrode sections are disposed on the cavity.

19. The thin film elastic wave resonator according to claim 14, wherein the supporting section is structured by the substrate and a supporting layer laminated for forming the cavity on the substrate, and the fourth and fifth electrode sections are disposed on the cavity.

20. The thin film elastic wave resonator according to claim 14, wherein the supporting section is structured by the substrate and an acoustic mirror formed by alternately laminating a layer in which an impedance is acoustically high and a layer in which an impedance is acoustically low, and the fourth and fifth electrode sections are disposed on the acoustic mirror.

21. The thin film elastic wave resonator according to claim 14, wherein a clearance between the first electrode section and the second and third electrode sections is equal to or greater than a thickness of the piezoelectric body.

22. A filter being structured by a plurality of thin film elastic wave resonators, wherein at least one of the plurality of thin film elastic wave resonators is the thin film elastic wave resonator according to claim 1.

23. A communication device including the filter according to claim 22.

* * * * *